(12) United States Patent
Maruyama et al.

(10) Patent No.: US 11,295,997 B2
(45) Date of Patent: Apr. 5, 2022

(54) SEMICONDUCTOR DEVICE MANUFACTURING METHOD AND SEMICONDUCTOR DEVICE

(71) Applicant: FUJI ELECTRIC CO., LTD., Kawasaki (JP)

(72) Inventors: Rikihiro Maruyama, Matsumoto (JP); Masaoki Miyakoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/884,037

(22) Filed: May 26, 2020

(65) Prior Publication Data

US 2020/0286800 A1 Sep. 10, 2020

Related U.S. Application Data

(63) Continuation of application No. PCT/JP2019/017637, filed on Apr. 25, 2019.

(30) Foreign Application Priority Data

Jun. 19, 2018 (JP) .............................. JP2018-115687

(51) Int. Cl.
*H01L 23/053* (2006.01)
*H01L 21/48* (2006.01)
(Continued)

(52) U.S. Cl.
CPC ........ *H01L 23/053* (2013.01); *H01L 21/4817* (2013.01); *H01L 23/3735* (2013.01);
(Continued)

(58) Field of Classification Search
CPC ............... H01L 23/053; H01L 21/4817; H01L 23/3735; H01L 24/73; H01L 25/072;
(Continued)

(56) References Cited

U.S. PATENT DOCUMENTS

2003/0141602 A1* 7/2003 Kobayashi ........... B23K 35/007
                                                              257/781
2004/0051172 A1* 3/2004 Miyazaki ................ H01L 23/36
                                                              257/706
(Continued)

FOREIGN PATENT DOCUMENTS

| EP | 2903024 A1 | 8/2015 |
| GB | 2310088 A | 8/1997 |
| JP | S5839046 A | 3/1983 |
| JP | 2007250964 A | 9/2007 |

(Continued)

OTHER PUBLICATIONS

International Search Report for PCT/JP2019/017637, dated Jun. 25, 2019.
(Continued)

*Primary Examiner* — Patricia D Valenzuela
(74) *Attorney, Agent, or Firm* — Rabin & Berdo, P.C.

(57) ABSTRACT

A method of manufacturing a semiconductor device prepares contact members, each of which has a cylindrical through-hole, and column-shaped connection terminals, each having a polygonal shape in a cross-sectional view along a length direction thereof, wherein a length of a diagonal of the polygonal shape is greater than an inner diameter of the through-holes. Chamfers with a curvature for fitting an inner surface of the through-holes are formed at corners of the connection terminal, and the connection terminals are press-fitted into the through-holes of the contacts. By doing so, the area of contact where the connection terminals press-fitted into the contacts contact the inner circumferential surfaces of the through-holes of the contacts is increased. This increases the tensile load of the connection terminals fitted into the contacts.

16 Claims, 12 Drawing Sheets

(51) Int. Cl.
  *H01L 23/373* (2006.01)
  *H01L 23/00* (2006.01)
  *H01L 25/07* (2006.01)
  *H01L 23/13* (2006.01)

(52) U.S. Cl.
  CPC ............ *H01L 24/73* (2013.01); *H01L 25/072* (2013.01); *H01L 23/13* (2013.01); *H01L 2224/73265* (2013.01); *H01L 2924/207* (2013.01)

(58) Field of Classification Search
  CPC ....... H01L 2224/73265; H01L 21/4853; H01L 23/49811; H01L 25/18; H01L 2224/32225; H01L 2224/48227; H01L 2224/48091; H01L 2224/48472; H01L 2224/48137; H01L 23/13; H01L 2924/207; H05K 2201/10318; H05K 2201/10257; H05K 2201/1031; H05K 3/4015
  See application file for complete search history.

(56) References Cited

U.S. PATENT DOCUMENTS

| | | | | |
|---|---|---|---|---|
| 2009/0194884 | A1* | 8/2009 | Stolze | H05K 3/3426 257/773 |
| 2010/0308940 | A1* | 12/2010 | Shirasaki | H01L 23/047 333/22 R |
| 2016/0343647 | A1 | 11/2016 | Kai et al. | |
| 2016/0380366 | A1 | 12/2016 | Onishi et al. | |

FOREIGN PATENT DOCUMENTS

| | | |
|---|---|---|
| JP | 2007281045 A | 10/2007 |
| JP | 2017011221 A | 1/2017 |

OTHER PUBLICATIONS

Written Opinion for PCT/JP2019/017637, dated Jun. 25, 2019.
Extended European Search Report (EESR) dated Jul. 23, 2021 for the corresponding EP patent application No. EP19822060.0.
Notice of reasons for refusal dated Jan. 18, 2022 for the corresponding JP patent application No. 2020-525325.

* cited by examiner

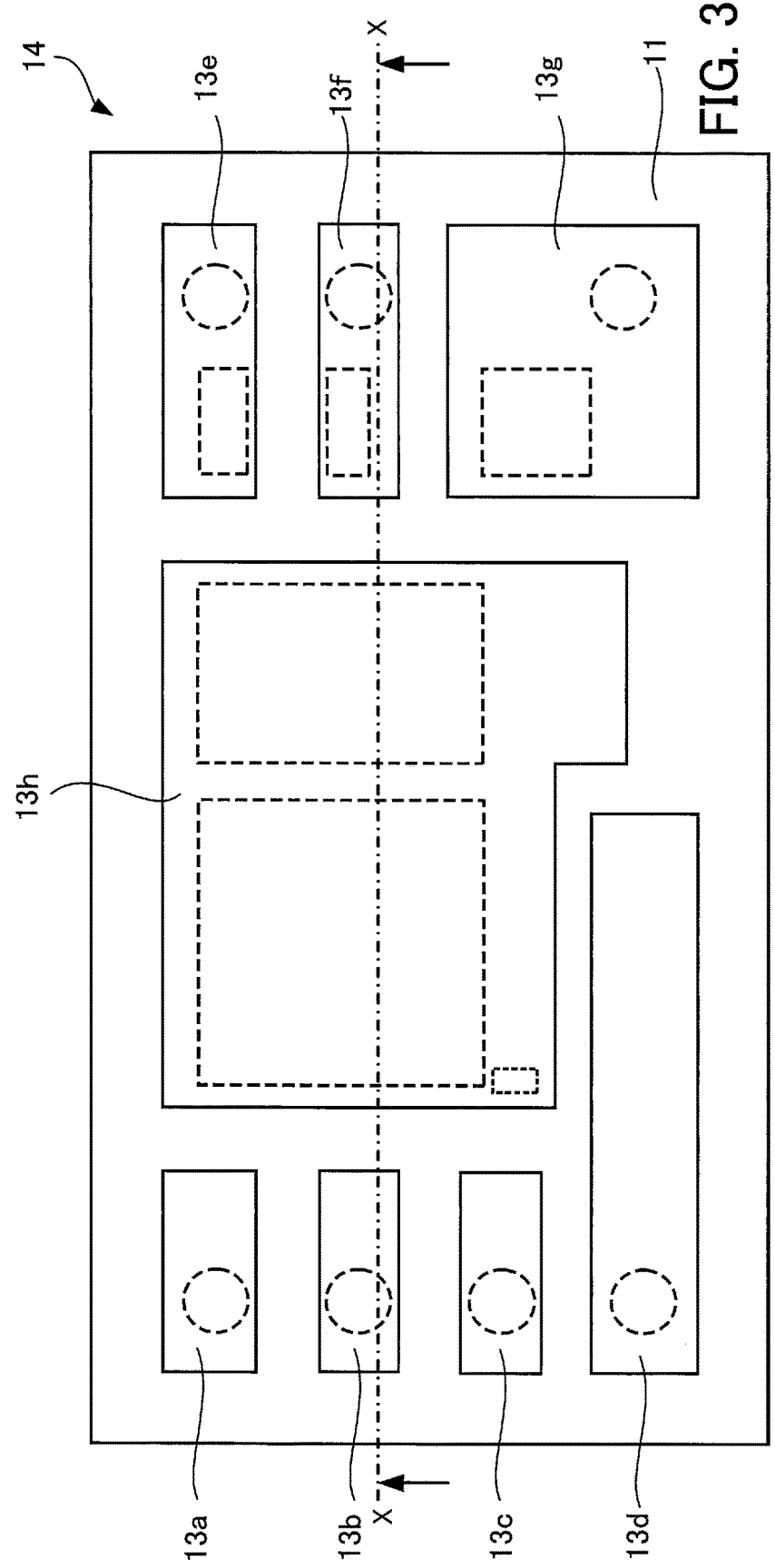
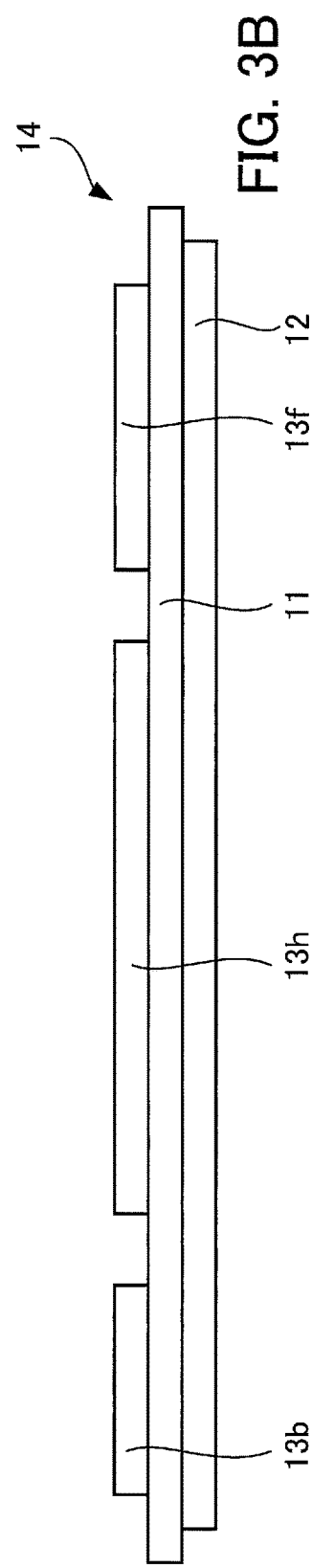
FIG. 3A
FIG. 3B

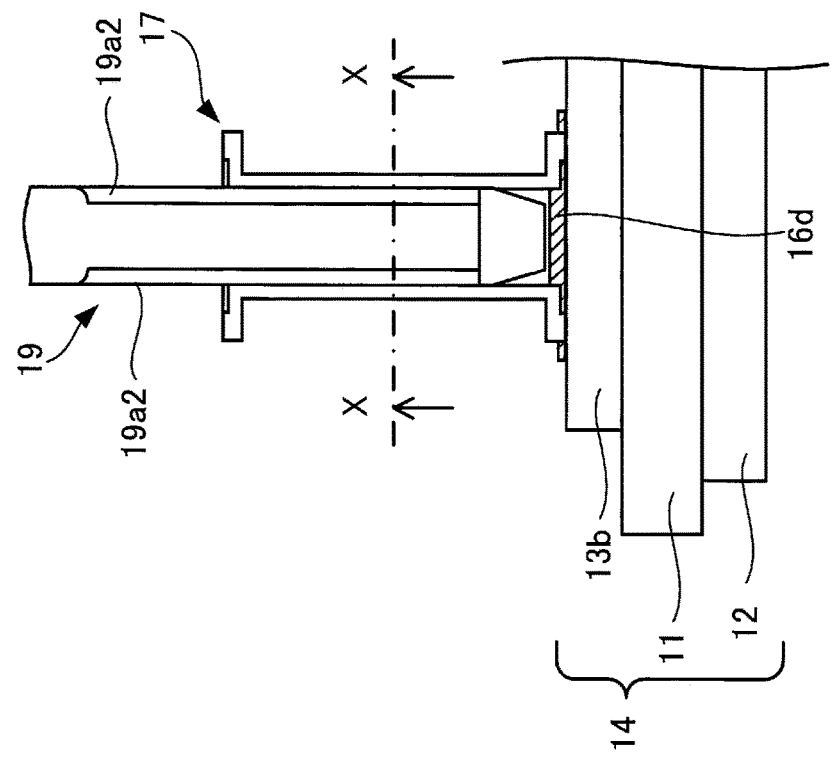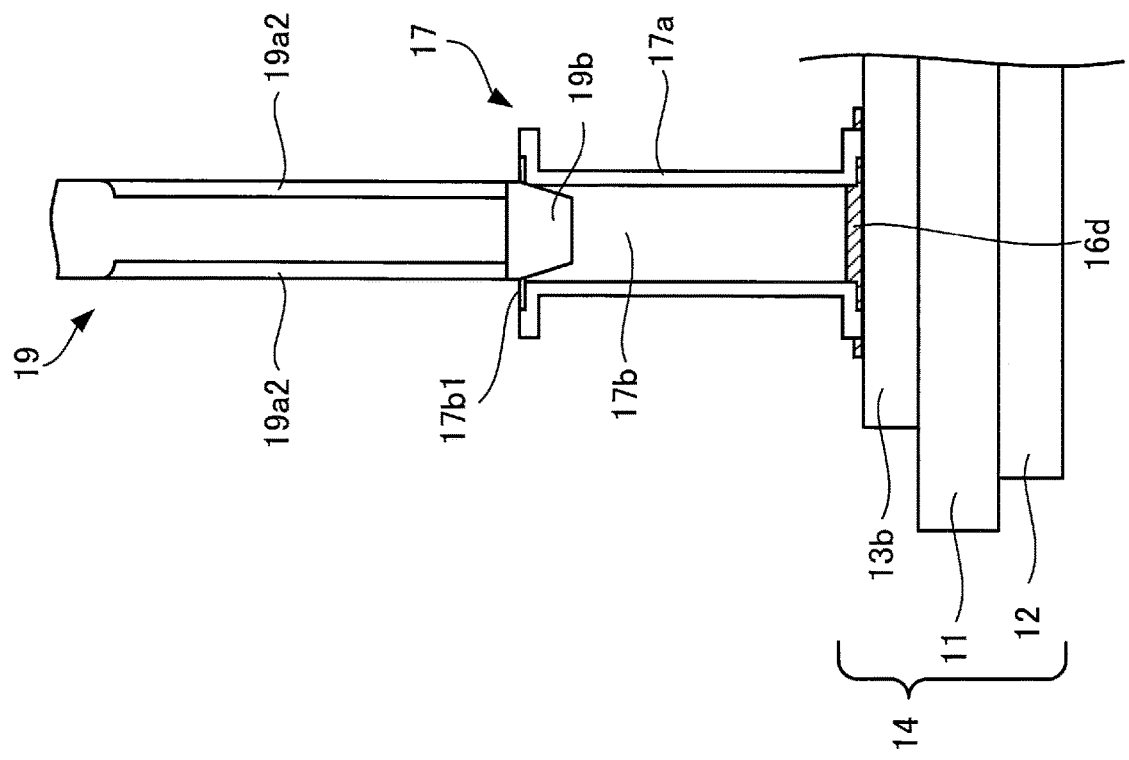

SEMICONDUCTOR DEVICE MANUFACTURING METHOD AND SEMICONDUCTOR DEVICE

CROSS-REFERENCE TO RELATED APPLICATION

This application is a continuation application of International Application PCT/JP2019/017637 filed on Apr. 25, 2019 which designated the U.S., which claims priority to Japanese Patent Application No. 2018-115687, filed on Jun. 19, 2018, the entire contents of which are incorporated herein by reference.

BACKGROUND OF THE INVENTION

1. Field of the Invention

The embodiment discussed herein relates to a semiconductor device manufacturing method and a semiconductor device.

2. Background of the Related Art

Semiconductor devices include semiconductor elements such as IGBTs (Insulted Gate Bipolar Transistors) and power MOSFETs (Metal Oxide Semiconductor Field Effect Transistors). These semiconductor devices are used for example as power converting devices.

A semiconductor device includes a board with an insulating plate and a plurality of circuit patterns formed on a front surface of the insulating plate. Semiconductor elements and connection terminals are disposed on the circuit patterns, and signals applied from the connection terminals are inputted into the semiconductor elements via the circuit patterns. Cylindrical contacts are used when attaching the connection terminals to the circuit patterns. The connection terminals are configured with larger diameters than the contacts. The connection terminals are press-fitted into the contacts that have been bonded onto the circuit patterns using solder, thereby electrically connecting the connection terminals to the circuit patterns via the contacts (see, for example, U.S. Patent Application Publication No. 2009/0194884).

In the semiconductor device described above, as one example, when a connection terminal in the shape of a prism has been press-fitted into a contact, the connection terminal will be kept inside the contact in a state where the corners of the connection terminal contact the inner circumferential surface of the contact. That is, since the part of the connection terminal that contacts the inside of the contact is limited to only the corners, it is easy for the connection terminal to come out of the contact. Here, it would be conceivable to increase the diameter of each connection terminal to increase the dimension that is press-fitted into a contact. However, in this case, there is a higher probability of damage to the contacts into which the connection terminals are press-fitted and an increase in cost due to the increase in size of the connection terminals.

SUMMARY OF THE INVENTION

According to an aspect, there is provided a method of manufacturing a semiconductor device, the method including: preparing a contact member, which has a cylindrical through-hole therein, and a column-shaped connection terminal, which has a polygonal shape in a cross-sectional view along a length direction thereof, wherein a length of a diagonal of the polygonal shape is greater than an inner diameter of the through-hole, forming at each corner of the connection terminal, a chamfer having a curvature so as to fit an inner surface of the through-hole, and press-fitting the connection terminal into the through-hole of the contact member.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 3A and 3B depict a ceramic circuit board included in the semiconductor device according to the present embodiment;

FIGS. 8A and 8B depict a press-fitting process in the method of manufacturing a semiconductor device according to the present embodiment;

DETAILED DESCRIPTION OF THE INVENTION

Figure 1:
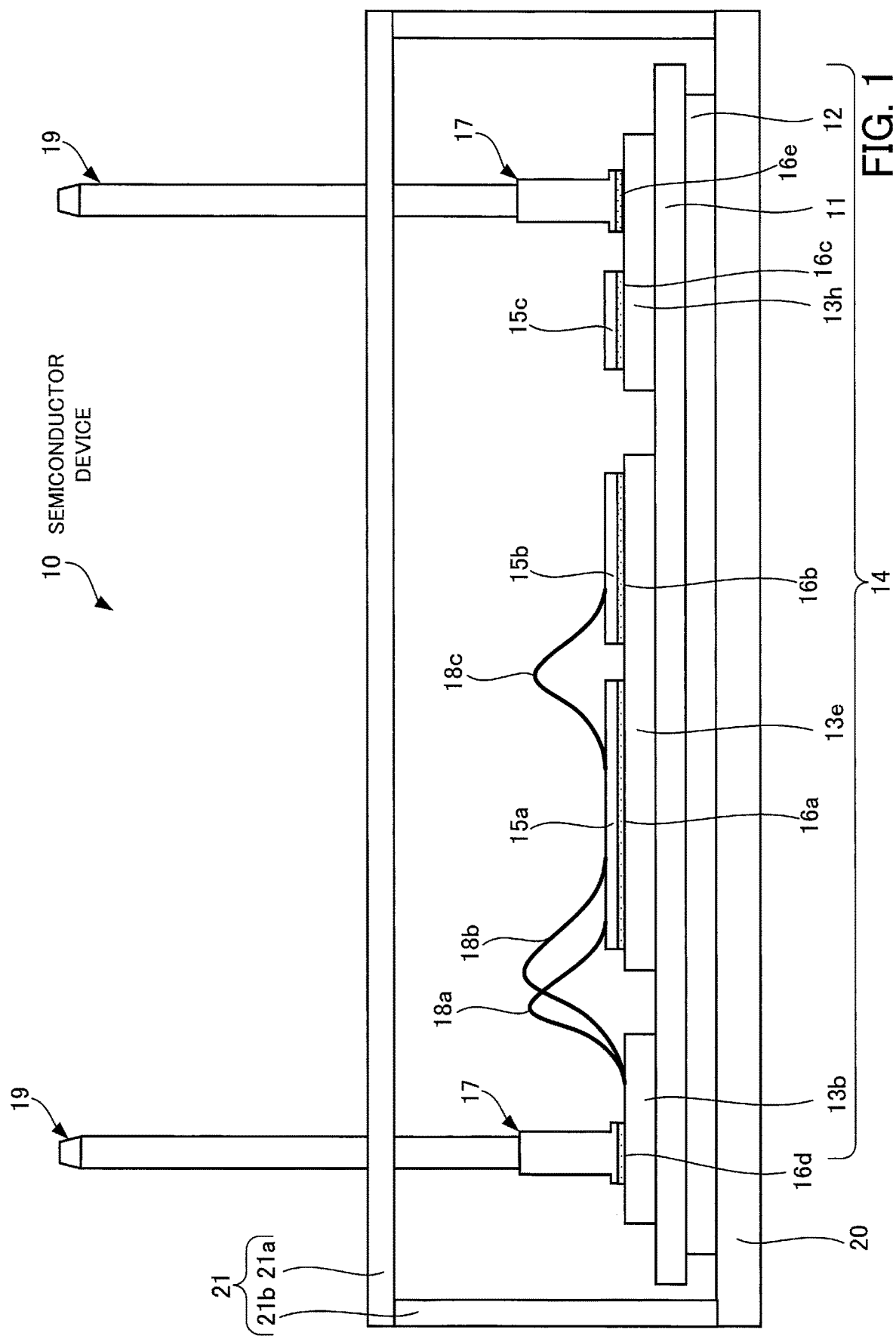
FIG. 1 depicts one example of a semiconductor device according to the present embodiment.

An embodiment will now be described with reference to the drawings. A semiconductor device according to the present embodiment will now be described with reference to FIG. 1. FIG. 1 depicts one example of a semiconductor device according to the present embodiment. As depicted in FIG. 1, a semiconductor device 10 includes a ceramic circuit board 14, and semiconductor elements 15a, 15b, and 15c and contacts 17 that are provided on a front surface of the ceramic circuit board 14. A column-shaped connection terminal 19 is attached to each of the contacts 17. Note that when no particular distinction is made between them, the semiconductor elements 15a, 15b, and 15c are collectively referred to as the "semiconductor elements 15". A plurality of semiconductor elements 15 are provided on the ceramic circuit board 14. FIG. 1 depicts the semiconductor elements 15a, 15b, and 15c out of these semiconductor elements 15. Electronic components may be mounted in place of the semiconductor elements 15 as needed. Note that examples of the electronic components referred to here include resistors, thermistors, capacitors, and surge absorbers.

The ceramic circuit board 14 includes an insulating plate 11, a metal plate 12 formed on a rear surface of the insulating plate 11, and circuit patterns 13b, 13e, and 13h formed on the front surface of the insulating plate 11. Semiconductor elements 15a, 15b and 15c are joined to the circuit patterns 13e and 13h via solder 16a, 16b and 16c. The contacts 17 are also joined to the circuit patterns 13b and 13h via solder 16d and 16e. Bonding wires 18a, 18b, and 18c electrically connect between the circuit pattern 13b on the ceramic circuit board 14 and an electrode on a front surface of the semiconductor element 15a and between electrodes on the front surfaces of the semiconductor elements 15a and 15b. Note that when no particular distinctions are made between the circuit patterns 13b, 13e, and 13h, the solder 16a, 16b, and 16c, and the bonding wires 18a, 18b, and 18c, the expressions "circuit patterns 13", "solder 16", and "bonding wires 18" are used.

A heat dissipating plate 20 is provided on a rear surface of the ceramic circuit board 14. The heat dissipating plate 20 may be joined to the rear surface of the ceramic circuit board 14 via a bonding layer such as solder, not illustrated. The ceramic circuit board 14, the semiconductor elements 15, and base portions and the like of the connection terminals 19 are enclosed within the heat dissipating plate 20 and a case 21. However, front ends of the connection terminals 19 extend out of the case 21. Also, the heat dissipating plate 20 does not need to be provided on the rear surface of the ceramic circuit board 14. When that configuration is used, the semiconductor element 15 and base portions and the like of the connection terminals 19 are housed by edges of the front surface of the ceramic circuit board 14 and the case 21. However, in this case also, the front ends of the connection terminals 19 will extend out of the case 21. Note that the expression "front surface" here refers to the surface of the semiconductor device 10 on the side where the front ends of the connection terminals 19 extend out of the case 21. The expression "rear surface" refers to the opposite surface to the front surface and indicates the side of the semiconductor device 10 where the heat dissipating plate 20 is provided. Note that the configuration of the semiconductor device 10 is described in detail below together with a flowchart of a method of manufacturing the semiconductor device 10.

Figure 2:
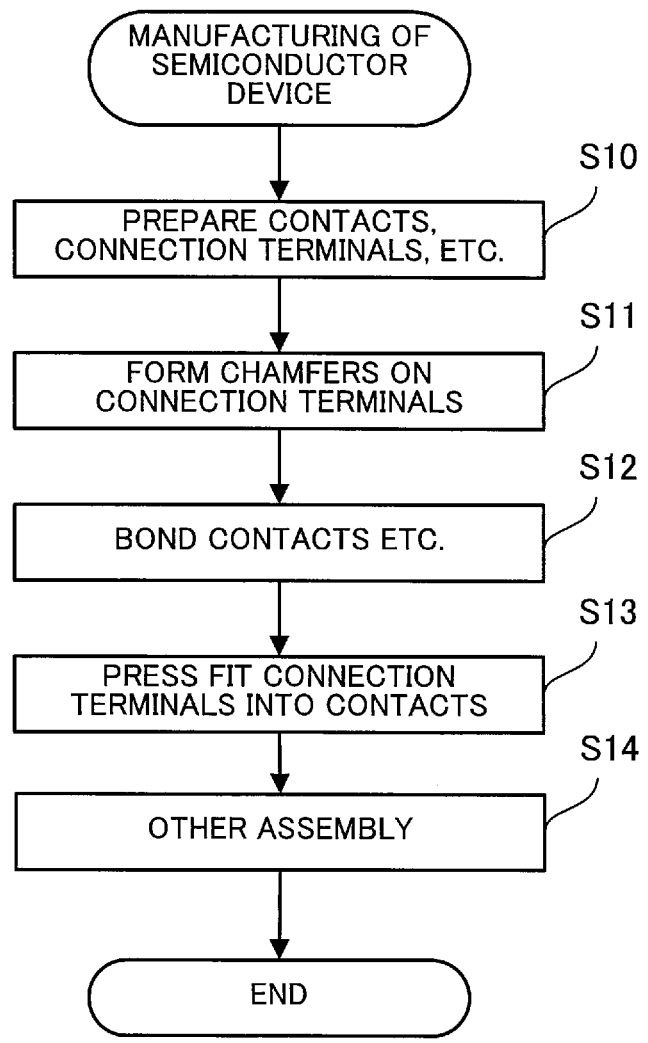
FIG. 2 is an example flowchart of a method of manufacturing a semiconductor device according to the present embodiment.

Next, an example method of manufacturing a semiconductor device 10 like the above will be described with reference to FIG. 2. FIG. 2 is an example flowchart of a method of manufacturing a semiconductor device according to the present embodiment. It is noted that the processes depicted in FIG. 2 may be performed manually, mechanically, or both.

[Step S10] Components of the semiconductor device 10, such as the ceramic circuit board 14, the semiconductor elements 15, the contacts 17, and the connection terminals 19 are prepared. Here, the ceramic circuit board 14, the contacts 17, and the connection terminals 19 will be described with reference to FIGS. 3 to 5.

Figure 4A:
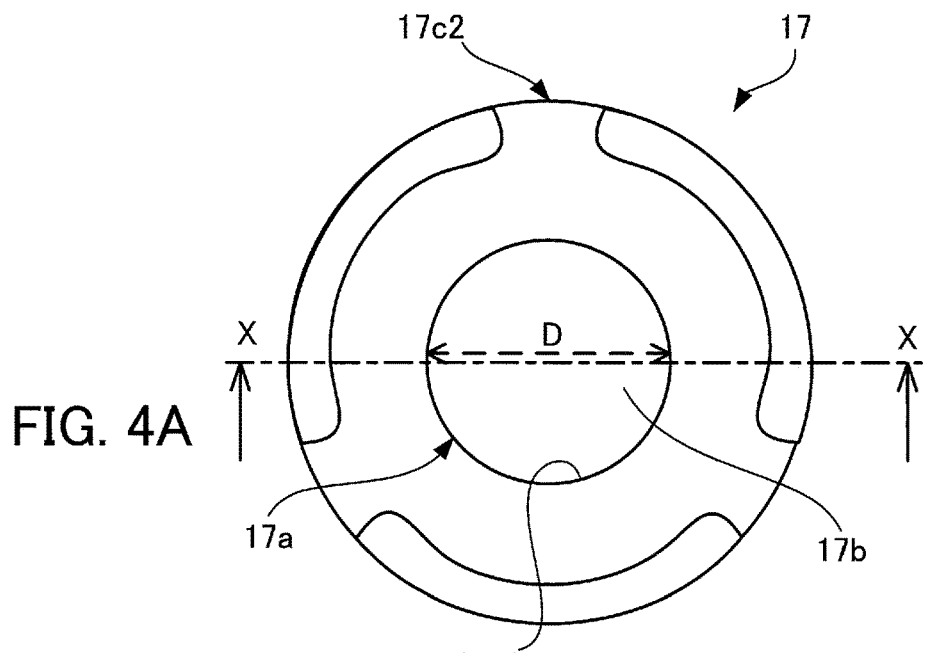
FIGS. 4A and 4B depict a contact included in the semiconductor device according to the present embodiment.
Figure 4B:
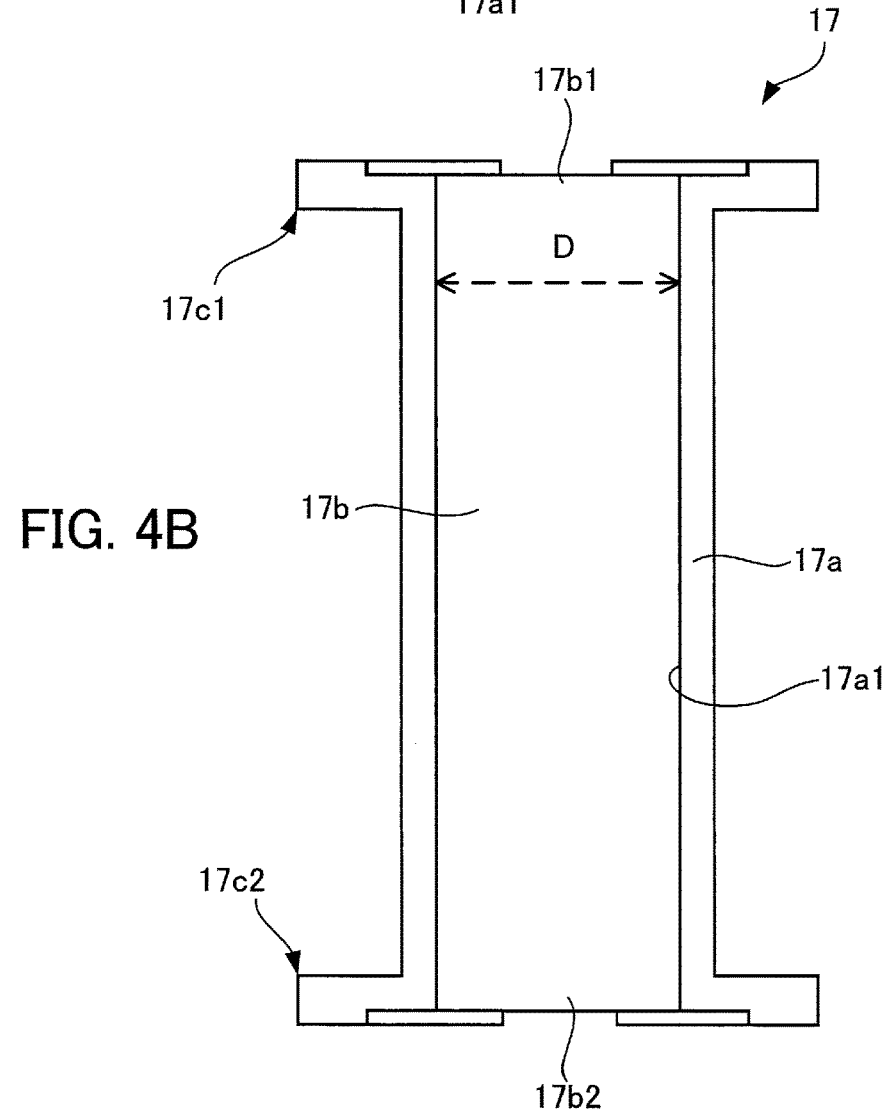
Figure 5B:
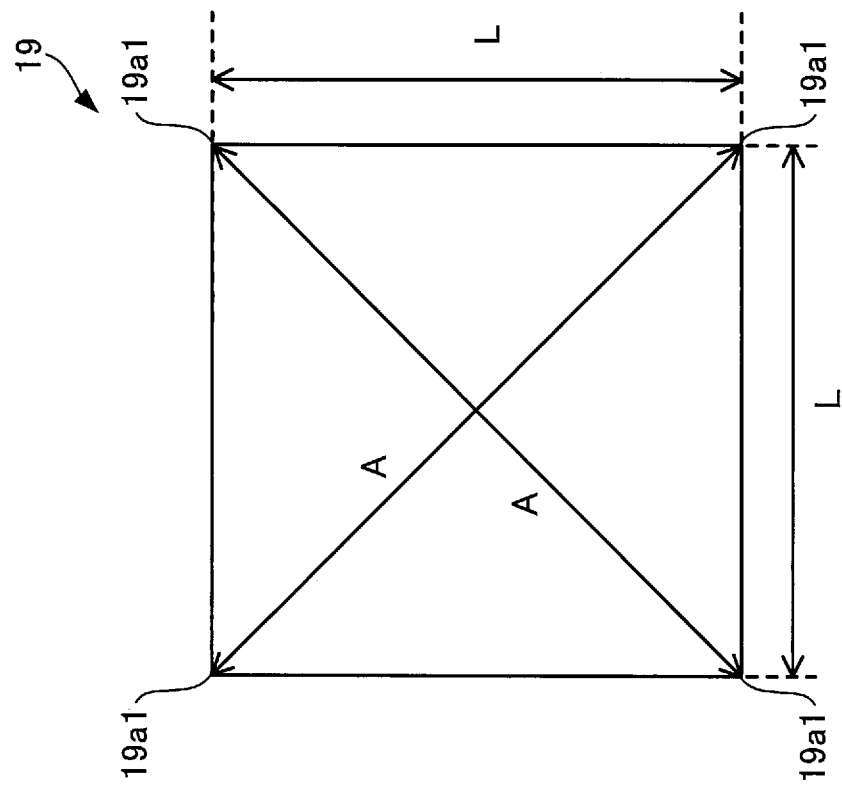
FIGS. 5A and 5B depict a connection terminal included in the semiconductor device according to the present embodiment.
Figure 5A:
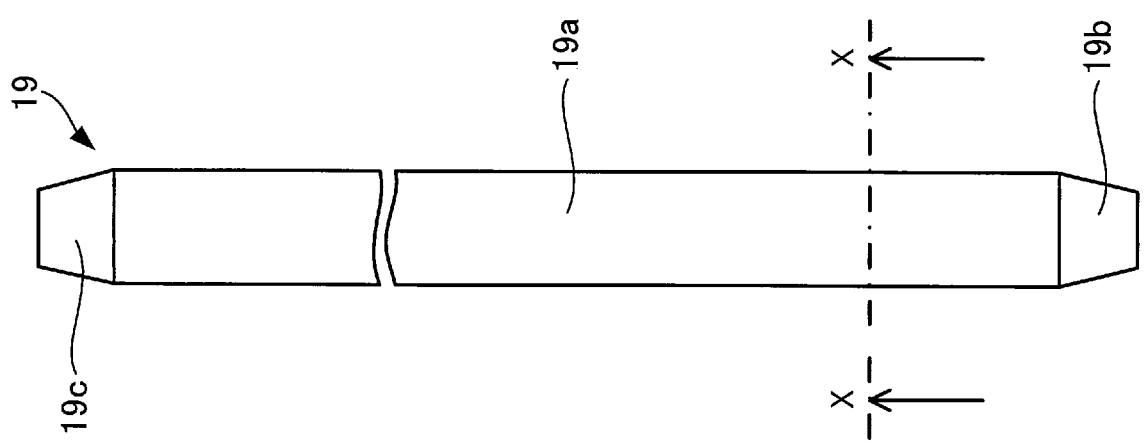

FIGS. 3A and 3B depict the ceramic circuit board included in the semiconductor device according to the present embodiment. Note that FIG. 3A is a plan view of the ceramic circuit board 14 and FIG. 3B is a cross-sectional view along a dot-dash line X-X in FIG. 3A. FIGS. 4A and 4B depict a contact included in the semiconductor device according to the present embodiment. Note that FIG. 4A is a plan view of a contact 17 and FIG. 4B is a cross-sectional view along a dot-dash line X-X in FIG. 4A. FIGS. 5A and 5B depicts a connection terminal included in the semiconductor device according to the present embodiment. Note that FIG. 5A is a front view of a connection terminal 19 and FIG. 5B is a cross-sectional view along a dot-dash line X-X in FIG. 5A.

As depicted in FIGS. 3A and 3B, the ceramic circuit board 14 includes the insulating plate 11, the metal plate 12 formed on the rear surface of the insulating plate 11, and the circuit patterns 13a, 13b, 13c, 13d, 13e, 13f, 13g, and 13h formed on the front surface of the insulating plate 11. The insulating plate 11 is made of a ceramic with high thermal conductivity, such as aluminum oxide, aluminum nitride, or silicon nitride, which have superior heat conductivity. The metal plate 12 is made of a metal such as aluminum, iron, silver, copper, or an alloy including at least one of these metals, which have superior thermal conductivity. The circuit patterns 13 are made of a metal with superior electrical conductivity, such as copper or a copper alloy. Note that the number and shapes of the circuit patterns 13 are mere examples, and a different number of patterns and shapes may be used. The circles drawn using broken lines on the circuit patterns 13 indicate the disposed positions of the contacts 17. The rectangles drawn using broken lines on the circuit patterns 13 indicate the disposed positions of the semiconductor elements 15. The illustrated disposed positions of the contacts 17 and the semiconductor elements 15 are mere examples, and the present embodiment is not limited to these positions. As the ceramic circuit board 14 with the above configuration, as examples, it is possible to use a DCB (Direct Copper Bonding) substrate or an AMB (Active Metal Brazed) substrate. The ceramic circuit board 14 is capable of conducting heat generated at the semiconductor elements 15 via the circuit patterns 13e, 13f, 13g, and 13h, the insulating plate 11, and the metal plate 12 to the heat dissipating plate 20 side.

As depicted in FIGS. 4A and 4B, the contacts 17 each include a body 17a in which a cylindrical through-hole 17b is formed and flanges 17c1 and 17c2 provided at open ends 17b1 and 17b2, respectively, of the body 17a. Here, an example is depicted where the flanges 17c1 and 17c2 are formed at both of the two open ends 17b1 and 17b2. However, a flange may be formed at one end only. These contacts 17 are made of aluminum, iron, silver, copper, or an alloy including at least one of these materials, which have superior electrical conductivity. To improve corrosion resistance, as one example, a metal such as nickel or gold may be formed on the surface of each contact 17 by plating or the like. In more detail, aside from nickel and gold, it is also possible to use a nickel-phosphorus alloy, a nickel-boron alloy, or the like. In addition, gold may be laminated on a nickel-phosphorus alloy. Note that the inner diameter D of the open ends 17b1 and 17b2 of the through-hole 17b is preferably at least 0.3 mm but not greater than 5.0 mm, and more preferably at least 0.6 mm but not greater than 2.5 mm.

As depicted in FIGS. 5A and 5B, each connection terminal 19 has a body 19a and tapered ends 19b and 19c respectively formed at both ends of the body 19a. In particular, the body 19a is formed in the shape of a prism, with a square cross section including corners 19a1. The length of a diagonal across the cross section of a connection terminal 19 is defined as "diagonal length (a length of diagonal) A". The length of one side in the circumferential direction of the cross section of a connection terminal 19 is defined as "length L". The connection terminals 19 are made of aluminum, iron, silver, copper, or an alloy including at least one of these metals, which have superior electrical conductivity. To improve corrosion resistance, as one example, a metal such as nickel or tin may be formed on the surface of each connection terminal 19 by plating or the like.

The semiconductor elements 15 include switching elements made of silicon or silicon carbide. As examples, the switching elements are IGBTs, power MOSFETs, or the like. As one example, each semiconductor element 15 has a drain electrode (or a collector electrode) as a main electrode on the rear surface, and a gate electrode and a source electrode (or an emitter electrode) as main electrodes on the front surface. As needed, the semiconductor elements 15 also include diodes. As examples, the diodes may be SBD (Schottky Barrier Diodes) or FWD (Freewheeling Diodes). These semiconductor elements 15 each have a cathode electrode as a main electrode on the rear surface and an anode electrode as a main electrode on the front surface.

Figure 6A:
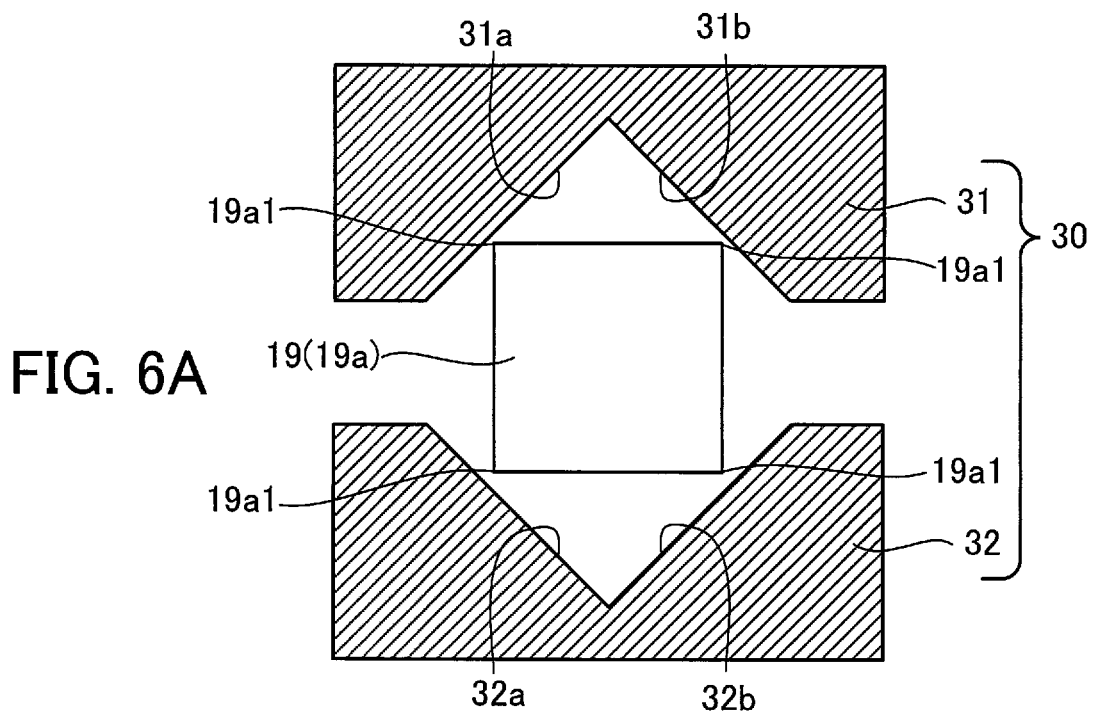
FIGS. 6A and 6B depict a chamfering process in a method of manufacturing a semiconductor device according to the present embodiment.
Figure 6B:
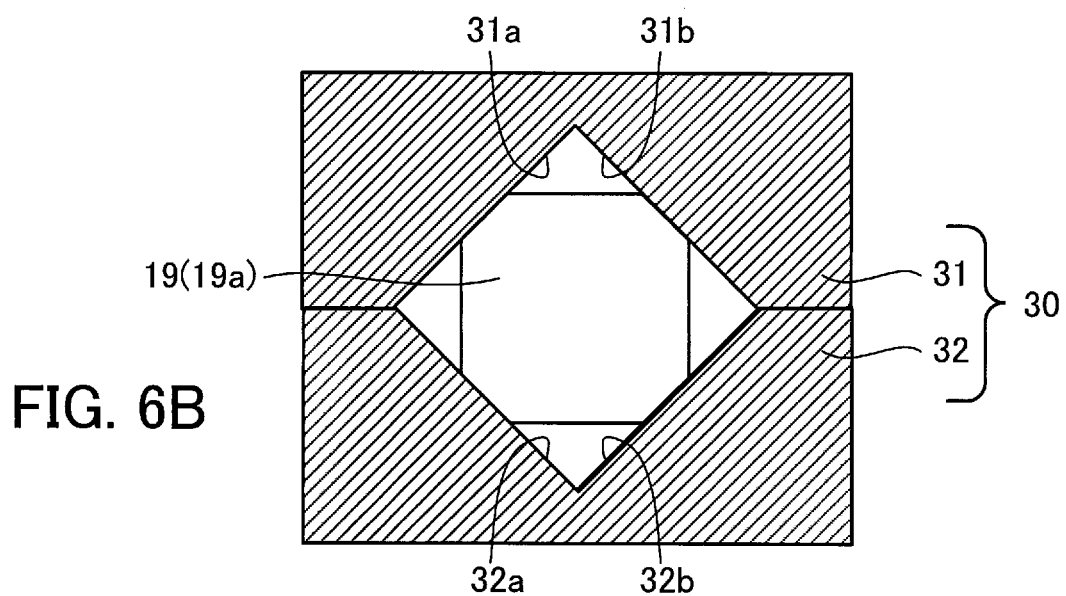

[Step S11] Chamfers are formed at the corners 19a1 of each connection terminal 19. The chamfering process for forming chamfers on a connection terminal 19 will now be described with reference to FIGS. 6A and 6B. FIGS. 6A and 6B depict a chamfering process in a method of manufacturing a semiconductor device according to the present embodiment. Note that FIGS. 6A and 6B are cross-sectional views depicting a connection terminal 19 during the chamfering process in a time series. A pressing jig 30 is used to form the chamfers at the corners 19a1 of (the body 19a of) each connection terminal 19. The pressing jig 30 has a pair of pressing portions 31 and 32 that sandwich one part of (the body 19a of) a connection terminal 19 along the length direction of the connection terminal 19. On the inside, the pressing portions 31 and 32 respectively have predetermined inclined surfaces 31a, 31b, 32a, and 32b that face each other.

The (body 19a of the) connection terminal 19 is set between the pressing portions 31 and 32 of the pressing jig 30 (see FIG. 6A). At this time, the corners 19a1 of (the body 19a of) the connection terminal 19 respectively face the inclined surfaces 31a, 31b, 32a, and 32b. In this state, pressure is applied to the pressing portions 31 and 32 so as to come together, resulting in (the body 19a of) the connection terminal 19 being sandwiched between the pressing portions 31 and 32 (see FIG. 6B). By doing so, the corners 19a1 of the connection terminal 19 are pressed by the pressing portions 31 and 32 and the inclined surfaces 31a, 31b, 32a, and 32b of the pressing portions 31 and 32 are transferred.

Figure 7B:
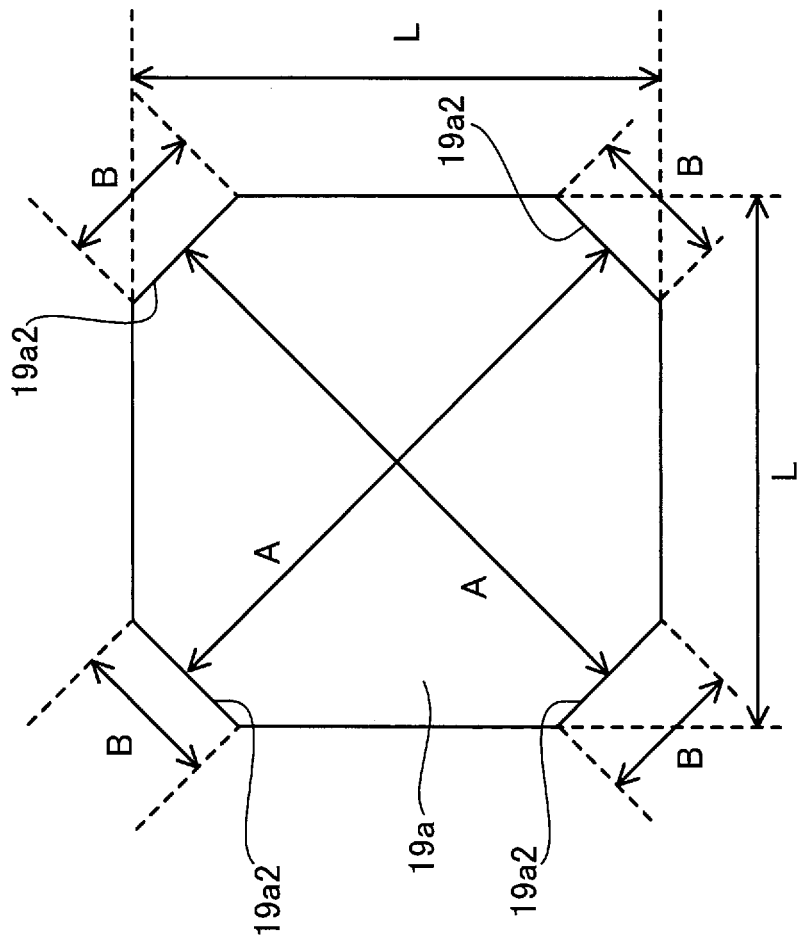
FIGS. 7A and 7B depict a connection terminal on which chamfers have been formed and which is included in the semiconductor device according to the present embodiment.
Figure 7A:
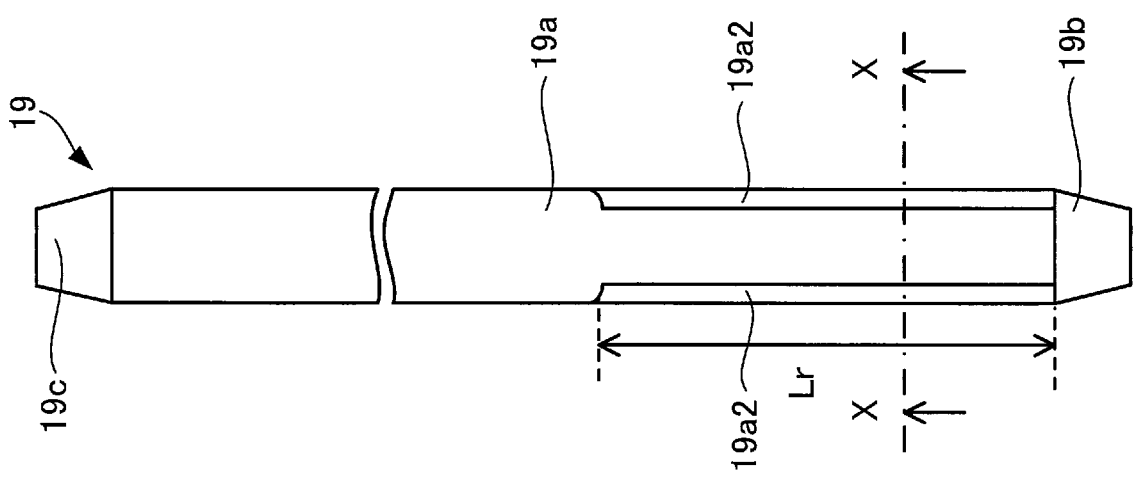

The pressing jig 30 is then removed from (the body 19a of) the connection terminal 19 that has been pressed by the pressing portions 31 and 32 in this way. Due to the corners 19a1 being pressed, a connection terminal 19 in which chamfers have been formed is obtained. A connection terminal in which the chamfers have been formed will now be described with reference to FIGS. 7A and 7B. FIGS. 7A and 7B depict a connection terminal in which chamfers have been formed and which is included in the semiconductor device according to the present embodiment. Note that FIG. 7A is a front view of the connection terminal 19 and FIG. 7B is a cross-sectional view along a dot-dash line X-X in FIG. 7A.

As depicted in FIGS. 7A and 7B, the connection terminal 19 has a chamfer 19a2 formed at each corner 19a1 of the body 19a that has been pressed by the pressing jig 30. Each chamfer 19a2 has a chamfered length Lr from a boundary of the end 19b of the body 19a, and has a chamfer width B in the circumferential direction of the body 19a. The diagonal length A across the cross section of a connection terminal 19 in this case is the distance between opposing chamfers 19a2. Note that the diagonal length A and the chamfer width B may be changed in accordance with the size of the regions of the pressing jig 30 surrounded by the inclined surfaces 31a, 31b, 32a, and 32b of the pressing portions 31 and 32. As one example, a pressing jig 30 where the distance between the inclined surfaces 31a and 32b and the distance between the inclined surfaces 31b and 32a differ when the pressing portions 31 and 32 are brought together may be prepared. The pressing jig 30 is selected as appropriate so that a connection terminal 19 with the desired diagonal length A and the chamfer width B are obtained. In addition, the diagonal length A is set so as to be longer than the inner diameter D of the contact 17. As one example, the diagonal length A is at least 1.02 times but not greater than 1.10 times the inner diameter D of the contact 17. Note that specific examples of the diagonal length A and the chamfer width B will be described later. Note that in step S11, an example case where the chamfers 19a2 are formed by pressing the corners 19a1 of the connection terminal 19 is described. However, so long as the desired chamfers 19a2 are formed on a connection terminal 19, a method aside from pressing may be used. An example of another method is cutting away the corners 19a1.

[Step S12] The contacts 17 are joined via solder to predetermined positions on the circuit patterns 13 of the ceramic circuit board 14. When doing so, the semiconductor elements 15 are joined to predetermined positions on the circuit patterns 13 via the solder 16. Note that as one example, the solder 16 is composed of lead-free solder whose main component is at least one of an alloy composed of tin, silver, and copper, an alloy composed of tin, zinc, and bismuth, an alloy composed of tin and copper, and an alloy composed of tin, silver, indium, and bismuth. Additives such as nickel, germanium, cobalt or silicon may also be included.

[Step S13] The connection terminals 19 in which the chamfers 19a2 were formed in step S11 are press-fitted into the contacts 17 that were joined to the ceramic circuit board in step S12. This press-fitting process will now be described with reference to FIGS. 8A and 8B. FIGS. 8A and 8B depict a press-fitting process in the method of manufacturing a semiconductor device according to the present embodiment. FIGS. 8A and 8B depict press-fitted states of the connection terminals 19 in the contacts 17 in a time series. Note that FIGS. 8A and 8B depict only one of the contacts 17 joined to the ceramic circuit board 14. Connection terminals 19 are press-fitted into the other contacts 17 in the same way. First, the tapered end 19b of a connection terminal 19 is set at the open end 17b1 of a contact 17 (see FIG. 8A). The connection terminal 19 is then vertically pressed toward the ceramic circuit board 14 with a predetermined pressure. At this time, since the diagonal length A of the connection terminal 19 is longer than the inner diameter D of the contact 17, the connection terminal 19 is press-fitted into the contact 17 (see FIG. 8B).

Figure 9B:
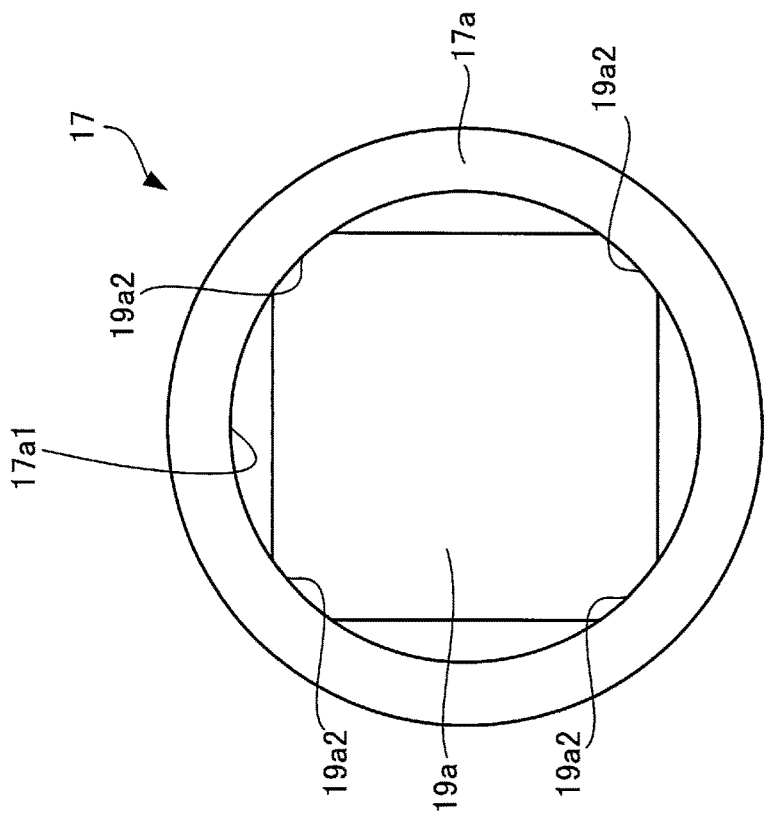
FIGS. 9A and 9B are diagrams useful in explaining a connection terminal that has been press-fitted into a contact.
Figure 9A:
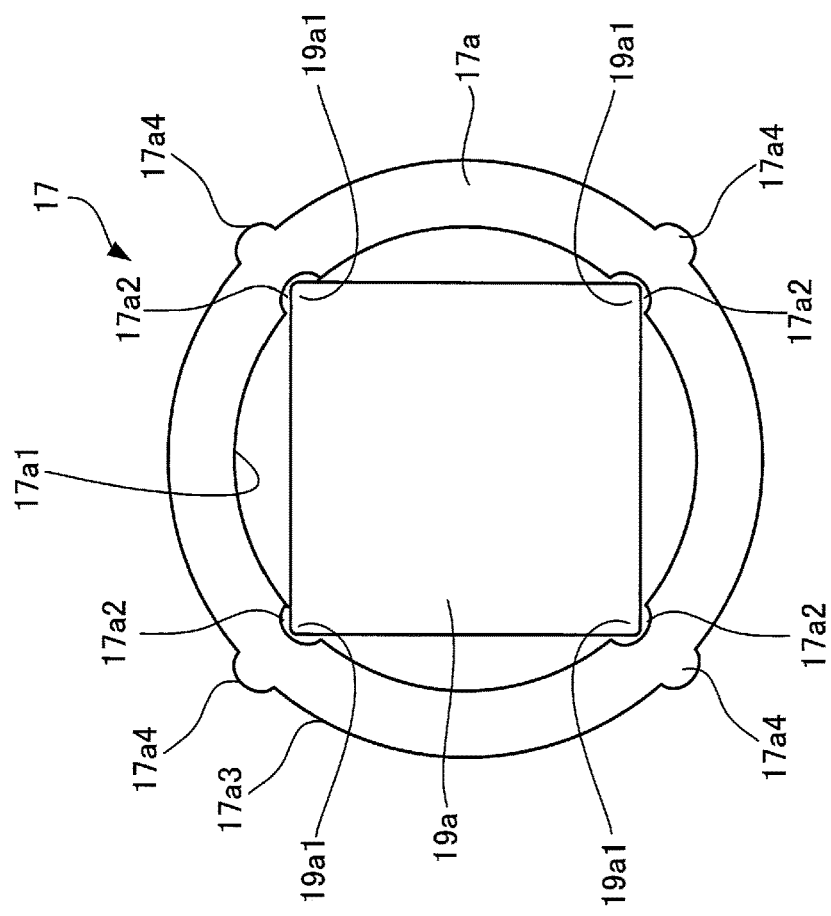

Next, a connection terminal 19 that has been press-fitted in this way into a contact 17 will be described with reference to FIGS. 9A and 9B. FIGS. 9A and 9B are diagrams useful in explaining a connection terminal that has been press-fitted into a contact. Note that FIGS. 9A and 9B are cross-sectional views along a dot-dash line X-X in FIG. 8B. FIG. 9A depicts a case (comparative example) where a connection terminal 19 in which the chamfers 19a2 are not formed at the corners 19a1 is press-fitted into a contact 17. FIG. 9B depicts a case where a connection terminal 19 that has the chamfers 19a2 formed at the corners 19a1 is press-fitted into a contact 17.

First, the case where a connection terminal 19 that does not have the chamfers 19a2 formed at the corners 19a1 (the state depicted in FIGS. 5A and 5B) is press-fitted into a contact 17 will be described as a comparative example. In this case, as depicted in FIG. 9A, the inner circumferential surface 17a1 of the contact 17 is pressed outward by the corners 19a1 to form concaves 17a2. Along with this, the outer circumferential surface 17a3 of the contact 17 deforms to produce convexes 17a4 at positions corresponding to the concaves 17a2. In this state, the connection terminal 19 contacts the concaves 17a2 formed on the inner circumferential surface 17a1 of the contact 17 at the corners 19a1, with gaps being produced between the corners 19a1 and the concaves 17a2. This means that the area of contact between the connection terminal 19 and the inner circumferential surface 17a1 of the contact 17 is limited to only the corners 19a1. Accordingly, a state is produced where the connection terminal 19 will easily come out of the contact 17.

A different case where a connection terminal 19 whose corners 19a1 have been pressed to form the chamfers 19a2 (that is, the state depicted in FIGS. 7A and 7B) is press-fitted into a contact 17 is also depicted. In this case, as depicted in FIG. 9B, the chamfers 19a2 of the connection terminal 19 contact the inner circumferential surface 17a1 of the contact 17. This increases the area of contact with the inner circumferential surface 17a1 of the contact 17 compared with the case of the connection terminal 19 with the corners 19a1 depicted in FIG. 9A. This means that the connection terminal 19 on which the chamfers 19a2 have been formed is more resistant to coming out of the contact 17 compared to the configuration in FIG. 9A. A connection terminal 19 on which the chamfers 19a2 have been formed will now be described further with reference to FIGS. 10A to 10C.

Figures 10A, 10B, 10C:
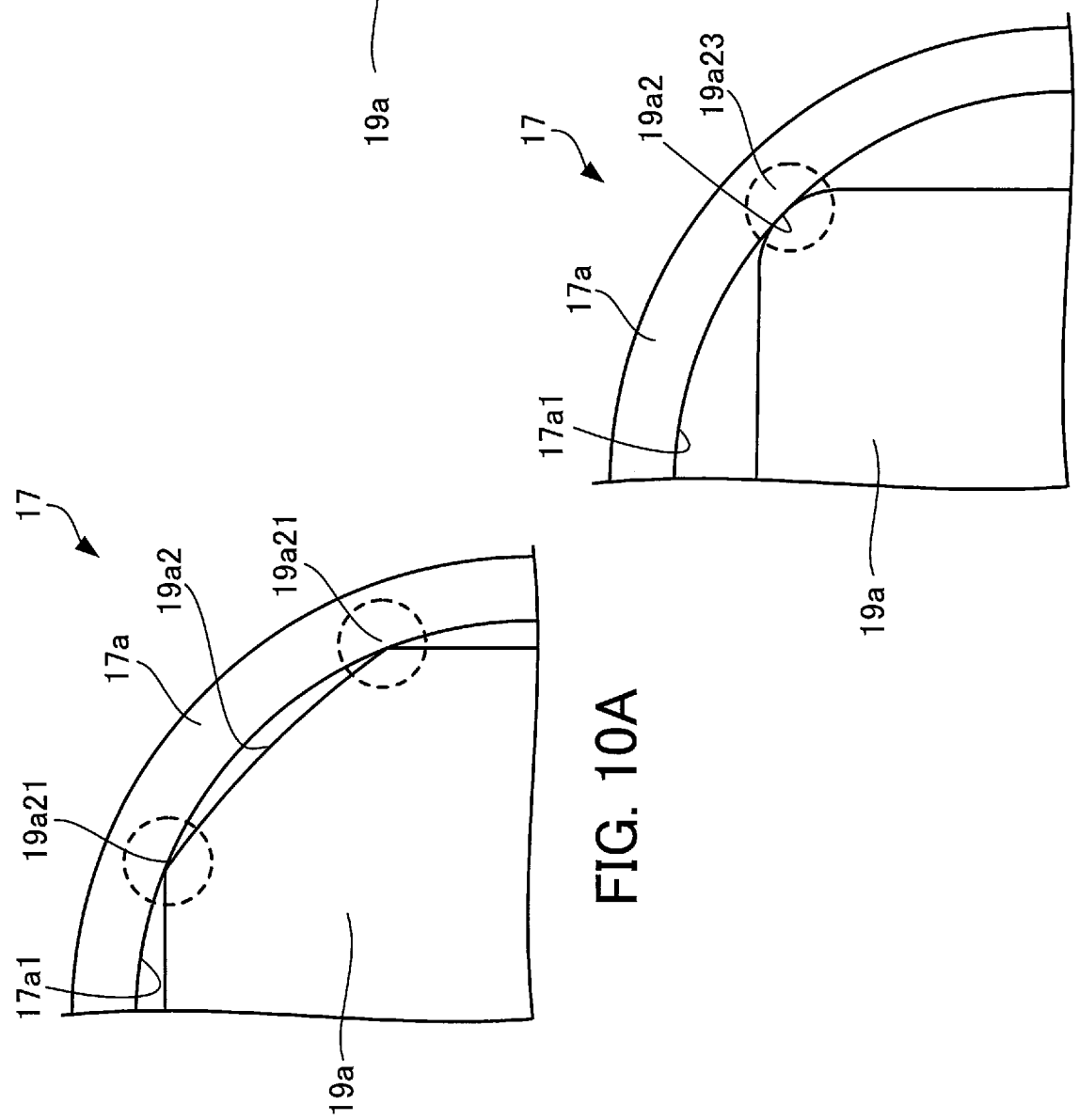
FIGS. 10A to 10C depict a principal part in enlargement to assist in explanation of a connection terminal that has been press-fitted into a contact.

FIGS. 10A to 10C depict a principal part in enlargement to assist in explanation of connection terminals that have been press-fitted into a contact. FIGS. 10A to 10C is an enlargement of a principal part of the cross section of connection terminals 19 that have been press-fitted into the contact 17. FIG. 10A depicts a case where the curvature of the chamfers 19a2 of a connection terminal 19 is significantly smaller than the curvature of the inner circumferential surface 17a1 of the contact 17. FIG. 10B depicts a case where the curvature of the chamfers 19a2 of a connection terminal 19 is close to the curvature of the inner circumferential surface 17a1 of the contact 17. FIG. 10C depicts a case where the curvature of the chamfers 19a2 of a connection terminal 19 is significantly larger than the curvature of the inner circumferential surface 17a1 of the contact 17. Here, the expression "curvature" is defined as the radius of a circle that passes through three adjacent points on a curve, that is, the reciprocal of the radius of curvature. The higher the curvature, the tighter the curve.

First, a case where the curvature of the chamfers 19a2 formed on a connection terminal 19 is significantly smaller than the curvature of the inner circumferential surface 17a1 of the contact 17 will be described. In this case, as depicted in FIG. 10A, two contacting portions 19a21, which are the edges of the chamfer 19a2, of the connection terminal 19 come into contact with the inner circumferential surface 17a1 of the contact 17. The case where the curvature of the chamfers 19a2 formed in a connection terminal 19 is very close to the curvature of the inner circumferential surface 17a1 of the contact 17 will now be described. In this case, as depicted in FIG. 10B, each chamfer 19a2 of the connection terminal 19 comes into contact across the inner circumferential surface 17a1 of the contact 17 with a contacting portion 19a22 as the origin. A further case where the curvature of the chamfers 19a2 formed on a connection terminal 19 is significantly larger than the curvature of the inner circumferential surface 17a1 of the contact 17 will now be described. In this case, as depicted in FIG. 10C, a contacting portion 19a23 at the tip of the chamfer 19a2 of the connection terminal 19 comes into contact with the inner circumferential surface 17a1 of the contact 17.

In FIGS. 10A, 10B, and 10C, the area of contact between the connection terminal 19 and the inner circumferential surface 17a1 of the contact 17 is larger than the case depicted in FIG. 9A. This means that the connection terminals 19 depicted in FIGS. 10A, 10B, and 10C are more resistant to coming out of the contact 17 than in the case of FIG. 9A. Also, in the case of FIG. 10B, the area of contact of the connection terminal 19 with the inner circumferential surface 17a1 of the contact 17 is further increased compared to the cases depicted in FIGS. 10A and 10C. Accordingly, the connection terminal 19 in FIG. 10B is more resistant to coming out of the contact 17 than the cases in FIG. 9A and FIGS. 10A and 10C. Therefore, as depicted in FIG. 10B, the curvature of the chamfers 19a2 of the connection terminal 19 needs to be set so that the inner circumferential surface 17a1 of the contact 17 is contacted by the contacting portion 19a22. Here, it is desirable for the curvature of the chamfers 19a2 of the connection terminal 19 to be at least 0.50 times but not greater than 2.0 times the curvature of the inner circumferential surface 17a1 of the contact 17. More preferably, the curvature is at least 0.66 times but not greater than 1.50 times the curvature of the inner circumferential surface 17a1. Note that the case where the connection terminal 19 in the present embodiment is in the shape of a prism and chamfers 19a2 are formed at the corners 19a1 has been described. However, the present embodiment is not limited to this, and the cross section in the length direction of the connection terminal 19 may have a polygonal shape and the curvature of the chamfer formed at each corner may be substantially equal to the curvature of the inner circumferential surface 17a1 of the contact 17.

[Step S14] On the ceramic circuit board 14 that has had the connection terminals 19 press-fitted into the contacts in this way, connections are made between the circuit patterns 13 and between the circuit patterns 13 and the semiconductor elements 15 using the bonding wires 18a, 18b, and 18c. The heat dissipating plate 20 is attached to the rear surface of the ceramic circuit board 14. The heat dissipating plate 20 may be bonded to the rear surface of the ceramic circuit board 14 via a bonding layer such as solder (not illustrated). Base parts of side walls 21b of the case 21 are then fixed to the edges of the heat dissipating plate 20 using adhesive or the like. In this way, the ceramic circuit board 14 may be housed inside the case 21 by housing the ceramic circuit board 14 within the side walls 21b of the case 21 and covering the upper opening of the side walls 21b with a cover 21a. The cover 21a of the case 21 has through-holes through which the connection terminals 19 extend. With this configuration, the connection terminals 19 extend out from the front surface of the case 21. As examples, the heat dissipating plate 20 is made of aluminum, iron, silver, copper, or an alloy including at least one of these metals, which have superior thermal conductivity. To improve the corrosion resistance, as one example, a material such as nickel may be formed on the surface of the heat dissipating plate 20 by plating or the like. In more detail, aside from nickel, a nickel-phosphorus alloy, a nickel-boron alloy, or the like may be used. Note that a radiator (not illustrated)

may be attached to the rear side of the heat dissipating plate via solder, silver solder, or the like to improve the dissipation of heat. As examples, the radiator used here is made of aluminum, iron, silver, copper, or an alloy including at least one of these metals, which have superior thermal conductivity. A cooling device including a fin or a heat sink composed of a plurality of fins and a cooling device that uses water cooling or the like may also be used as the radiator. The heat dissipating plate 20 may be integrally formed with this type of radiator. In that case, the heat dissipating plate 20 is made of aluminum, iron, silver, copper, or an alloy including at least one of these materials that has superior thermal conductivity. In order to improve the corrosion resistance, as one example, a material such as nickel may be formed by plating or the like on the surface of the heat dissipating plate 20 that is integrated with the cooler. In more detail, aside from nickel, a nickel-phosphorus alloy, a nickel-boron alloy, or the like may be used.

As one example, the case 21 has a box-like shape with through-holes in the front surface through which the connection terminals 19 extend, and has an open rear surface. The case 21 is made of a thermoplastic resin. Examples of the resin include polyphenylene sulfide (PPS), polybutylene terephthalate (PBT) resin, polybutylene succinate (PBS) resin, polyamide (PA) resin, and acrylonitrile butadiene styrene (ABS) resin. It is also possible to seal the inside of the case 21 with a sealing member (not illustrated). As examples, the sealing member is made of a thermosetting resin, such as maleimide-modified epoxy resin, maleimide-modified phenol resin, and maleimide resin. The sealing member may also be made of gel. A gel-type sealing member is injected into the case 21 from a predetermined injection port formed in the case 21 and seals the ceramic circuit board 14, the semiconductor elements 15, the contacts 17, the bonding wires 18a, 18b, and 18c, and parts of the connection terminals 19 on the heat dissipating plate 20.

It is also possible to not provide the heat dissipating plate 20 on the rear surface of the ceramic circuit board 14. In this case, the base parts of the side walls 21b of the case 21 are fixed to the edges of the front surface of the ceramic circuit board 14 using adhesive or the like. The semiconductor elements 15, the base parts of the connection terminals 19, and the like are housed in the side walls 21b and the cover 21a of the case 21. However, in this case also, the ends of the connection terminals 19 extend out of the case 21. By using the above method of manufacturing, it is possible to manufacture the semiconductor device 10 depicted in FIG. 1.

Figure 11A:
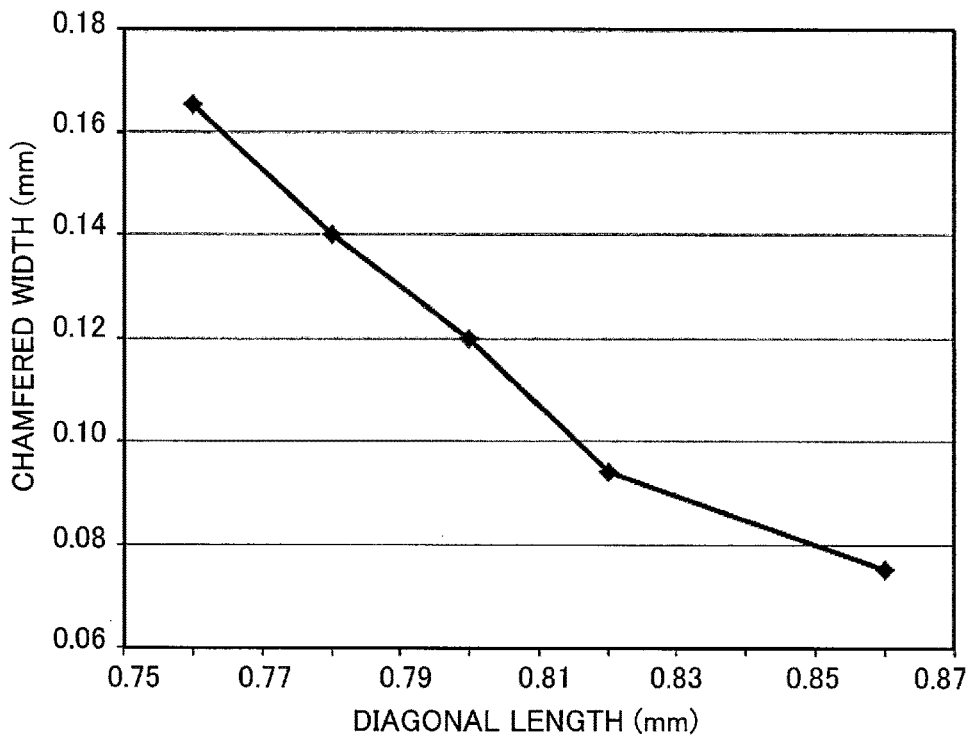
FIGS. 11A and 11B illustrate graphs depicting chamfer width and contact ratio with respect to diagonal length of the connection terminal.
Figure 11B:
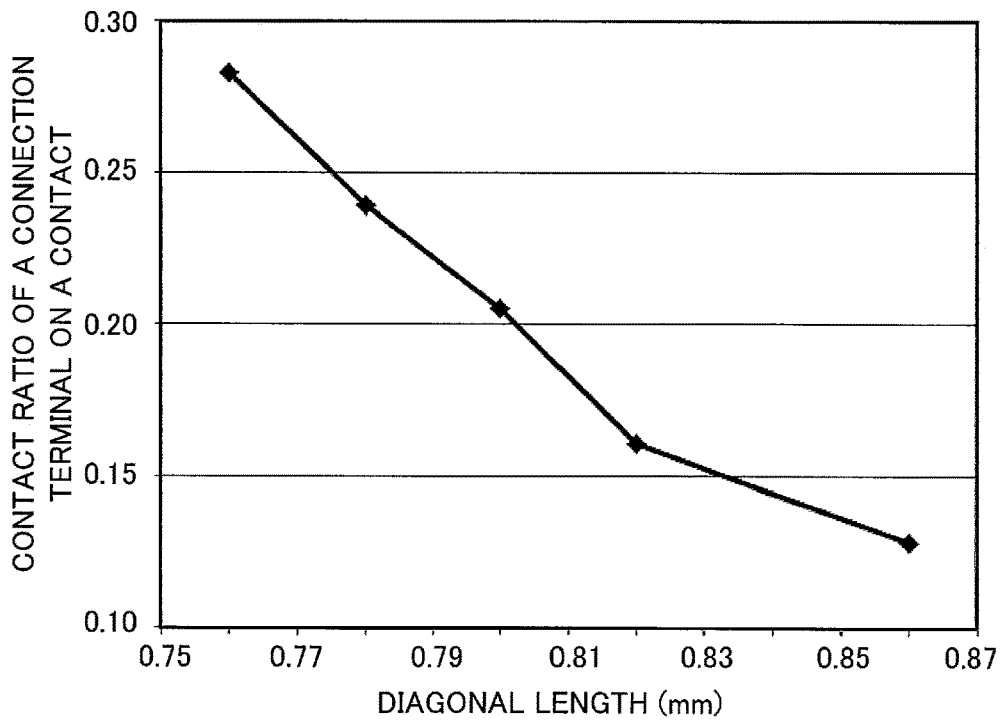

Next, the tensile load of the connection terminals 19 on the contacts 17 with respect to the diagonal length A of the connection terminals 19 and the chamfer width B of the chamfers 19a2 will be described with reference to FIGS. 11A, 11B and 12. FIGS. 11A and 11B illustrate graphs depicting chamfer width and the contact ratio with respect to the diagonal length of the connection terminal. Note that FIG. 11A depicts the chamfer width B of the chamfers 19a2 with respect to the diagonal length A of the connection terminals 19, and FIG. 11B depicts the contact ratio of a connection terminal 19 on a contact 17 with respect to the diagonal length A of the connection terminals 19. The horizontal axes in FIGS. 11A and 11B represent the diagonal length A (in mm) of each connection terminal 19. The vertical axis in FIG. 11A represents the chamfer width B (in mm) of the chamfers 19a2 of a connection terminal 19, and the vertical axis in FIG. 11B represents the contact ratio.

Figure 12:
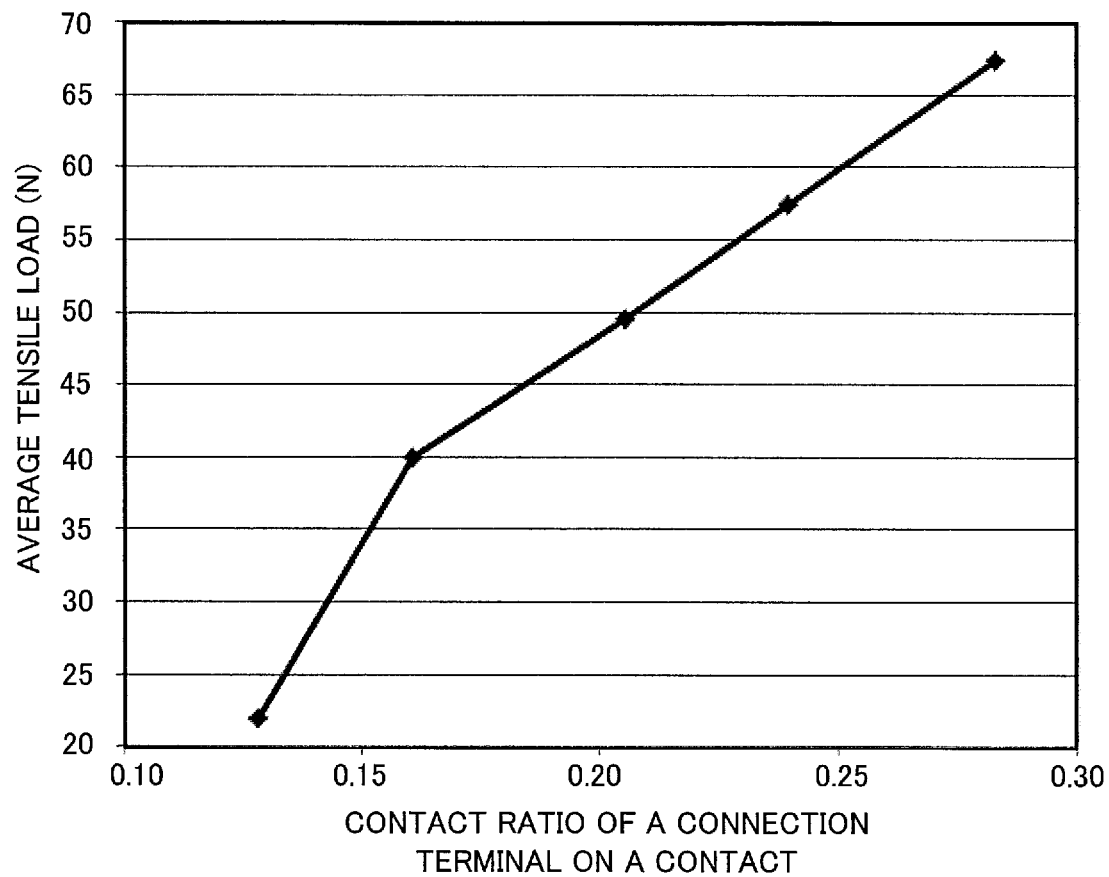
FIG. 12 illustrates a graph depicting average tensile load of a connection terminal with respect to the contact ratio of the connection terminal on a contact.

FIG. 12 illustrates a graph depicting the average tensile load of a connection terminal with respect to the contact ratio between the connection terminal and a contact. Note that the horizontal axis in FIG. 12 represents the contact ratio of a connection terminal 19 on a contact 17. The vertical axis in FIG. 12 represents the average tensile load (N). The expression "average tensile load" refers to the tensile load when a connection terminal 19 that has been press-fitted into a contact 17 is pulled out to remove the connection terminal 19, and is the average of tensile loads obtained by pulling the connection terminal out a plurality of times.

First, connection terminals 19 used for measuring the tensile load are formed using a pressing jig 30 which is capable of forming various diagonal lengths A and chamfer widths B. As depicted in FIG. 11A, the diagonal length A and the chamfer width B of the connection terminals 19 formed in this way are respectively 0.86 mm and 0.075 mm, 0.82 mm and 0.094 mm, 0.8 mm and 0.12 mm, 0.78 mm and 0.14 mm, and 0.76 mm and 0.166 mm. That is, as the diagonal length A decreases, the chamfer width B increases. Note that as described earlier, the curvature of the chamfers 19a2 of the connection terminals 19 is at least 0.50 times but not greater than 2.0 times the curvature of the inner circumferential surfaces 17a1 of the contacts 17. Meanwhile, the inner diameter D of the through-holes 17b of the contacts 17 used for measuring the tensile load is 0.75 mm, and the inner circumference of the through-holes 17b is 2.36 (=0.75×3.14) mm. The connection terminals 19 described above are respectively press-fitted into these contacts 17. When doing so, the proportion of the contacting part (that is, the contact ratio) of the connection terminals 19 on the inner circumferential surface 17a1 of the contacts 17 may be calculated according to Equation (1) below.

Contact ratio={chamfered length Lr of chamfer 19a2×chamfer width B×4 (that is, total area of the chamfers 19a2 on one connection terminal 19)}/{inner circumference of inner circumferential surface 17a1 of contact 17×chamfered length Lr of chamfers 19a2 (press-fitted area of connection terminal 19)}

={chamfer width B×4}/{inner circumference of inner circumferential surface 17a1 of contact 17}    (1)

With respect to the diagonal length A of a connection terminal 19, the contact ratio calculated in this way increases as the diagonal length A decreases, as depicted in FIG. 11B. This is because the chamfer width B increases as the diagonal length A decreases. In addition, as depicted in FIG. 12, it was understood that the average tensile load of a connection terminal 19 with this contact ratio with the contact 17 increases as the diagonal length A decreases, that is, the average tensile load increases as the contact ratio increases. In particular, when the average tensile load is around 50 N or higher, stable press-fitting of a connection terminal 19 into a contact 17 may be maintained. For this reason, it is desirable for the contact ratio to be at least 0.20. Although not depicted in FIGS. 11A, 11B and 12, when the diagonal length A of the connection terminal 19 is 0.73 mm, the contact ratio falls and the average tensile load in this case also falls. This means that it is desirable for the contact ratio to be not greater than 0.28.

The method of manufacturing the semiconductor device 10 described above prepares the contacts 17, which are each equipped with a cylindrical through-hole 17b, and the connection terminals 19, which are in the shape of a prism, have a polygonal cross section with respect to the length direction, and a diagonal length across the cross section which is greater than the inner diameter of the through-holes 17b.

Chamfers 19a2 whose curvature corresponds to the inner surface of the through-holes 17b are formed at the corners of the connection terminals 19, and the connection terminals 19 are press-fitted into the through-holes 17b of the contacts 17. In the semiconductor device 10 manufactured as described above, the connection terminals 19 press-fitted into the contacts 17 have an increased area of contact with the inner circumferential surfaces 17a1 of the through-holes 17b of the contacts 17. By doing so, the tensile load of the connection terminals 19 on the contacts 17 increases. This means that it is possible to stably press-fit the connection terminals 19, regardless of the material and surface condition of the press-fitted parts of the contacts 17. The connection terminals 19 are also more resistant to coming out of the contacts 17. By merely forming the chamfers 19a2 on the connection terminals 19, the tensile load of the connection terminals 19 on the contacts 17 is increased. This means that it is not needed to increase the diagonal length A of the connection terminals 19 for the same purpose, and it also eliminates the need of increasing the size of the connection terminals 19. By doing so, it is possible to suppress an increase in cost.

According to the present embodiment, it is possible to increase a tensile load of connection terminals fitted into contacts and suppress a drop in reliability of a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A method of manufacturing a semiconductor device, the method comprising:
   preparing a contact member, which has a cylindrical through-hole therein, and a column-shaped connection terminal, which has a polygonal shape in a cross-sectional view along a length direction thereof, wherein
      a length of a diagonal of the polygonal shape is greater than an inner diameter of the through-hole, and
      the contact member has a first length in a length direction thereof parallel to the length direction of the connection terminal;
   forming at each corner of the connection terminal, a chamfer having a curvature so as to fit an inner surface of the through-hole, the chamfer being formed to have a second length in the length direction of the connection terminal, the second length being greater than the first length; and
   press-fitting the connection terminal into the through-hole of the contact member.

2. The method of manufacturing a semiconductor device according to claim 1, wherein the curvature of each chamfer is not less than 0.50 times but not greater than 2.0 times a curvature of the inner surface of the through-hole.

3. The method of manufacturing a semiconductor device according to claim 1, wherein the forming a chamfer includes applying pressing force against each corner of the connection terminal to have the chamfer.

4. The method of manufacturing a semiconductor device according to claim 1, wherein the connection terminal has a rectangular shape.

5. The method of manufacturing a semiconductor device according to claim 4, wherein the length of the diagonal of the connection terminal after the forming a chamfer is not less than 1.02 times but not greater than 1.10 times the inner diameter of the through-hole.

6. The method of manufacturing a semiconductor device according to claim 4, wherein the forming a chamfer includes forming the chamfer at the each corner so that a sum of chamfer widths in a circumferential direction thereof of the connection terminal is not less than 0.20 times but not greater than 0.28 times an inner circumference of the through-hole.

7. The method of manufacturing a semiconductor device according to claim 1, wherein
   the preparing a column-shaped connection terminal includes preparing the column-shaped connection terminal having a body part and two opposite end portions in the length direction of the connection terminal, and
   the forming at each corner of the connection terminal, a chamfer includes forming the chamfer at said each corner of the body part of the connection terminal in the length direction of the connection terminal.

8. A semiconductor device, comprising:
   a contact member having a cylindrical through-hole therein, the contact member having a first length in a length direction thereof; and
   a column-shaped connection terminal which has a polygonal shape in a cross-sectional view along a length direction thereof, has a chamfer having a curvature so as to fit an inner surface of the through-hole, at each corner of the polygonal shape, each chamfer contacting with the inner surface of the through-hole of the contact member by the connection terminal being press-fitted into the through-hole, said each chamfer having a second length in a length direction of the connection terminal parallel to the length direction of the contact member, the second length being greater than the first length.

9. The semiconductor device according to claim 8, wherein the connection terminal has a rectangular shape.

10. The semiconductor device according to claim 9, wherein the curvature of each chamfer is not less than 0.50 times but not greater than 2.0 times a curvature of the inner surface of the through-hole.

11. The semiconductor device according to claim 9, wherein a sum of chamfer widths in a circumferential direction of said each chamfer of the connection terminal is not less than 0.20 times but not greater than 0.28 times an inner circumference of the through-hole.

12. The semiconductor device according to claim 8, wherein the contact member has a nickel plating layer or nickel alloy plating layer on a surface thereof.

13. The semiconductor device according to claim 8, wherein the connection terminal has a nickel plating layer or nickel alloy plating layer on a surface thereof.

14. The semiconductor device according to claim 8, wherein the press-fitted connection terminal has a tapered end at at least one end.

15. The semiconductor device according to claim 8, wherein each chamfer of the connection terminal is in contact with the inner surface of the through-hole, with a contacting portion that contacts the inner surface of the through-hole as an origin.

16. The semiconductor device according to claim 8, wherein the connection terminal has a body part and two opposite end portions in the length direction of the connection terminal, and said each chamfer is formed at said each corner of the body part of the connection terminal in the length direction of the connection terminal.

\* \* \* \* \*